United States Patent [19]

Inoko et al.

[11] 4,196,018

[45] Apr. 1, 1980

[54] PROCESS AND APPARATUS FOR WASHING PHOTOSENSITIVE RESIN PRINTING PLATES

[75] Inventors: Michio Inoko, Koganei; Shinichi Kawatsuji, Fuji; Takeshi Yamagata, Hachioji, all of Japan

[73] Assignee: Asahi Kasei Kogyo Kabushiki Kaisha, Osaka, Japan

[21] Appl. No.: 923,702

[22] Filed: Jul. 11, 1978

[30] Foreign Application Priority Data

Jul. 18, 1977 [JP] Japan .................................. 52-85094

[51] Int. Cl.² ............................................ B08B 1/02
[52] U.S. Cl. .......................................... 134/6; 15/77; 134/10; 134/33; 134/38
[58] Field of Search .................... 134/6, 10, 33, 38, 79; 15/77, 256.52; 101/425; 427/368

[56] References Cited

U.S. PATENT DOCUMENTS

| | | | |
|---|---|---|---|
| 2,347,511 | 4/1944 | Scarzello et al. | 15/77 X |
| 2,919,706 | 1/1960 | Williams | 134/79 X |
| 3,120,805 | 2/1964 | Simon | 15/256.52 X |
| 3,946,454 | 3/1976 | Holm et al. | 15/77 |
| 4,023,229 | 5/1977 | Blight | 15/77 |
| 4,081,815 | 3/1978 | Horner | 15/77 X |

FOREIGN PATENT DOCUMENTS

| | | | |
|---|---|---|---|
| 5311 | of 1899 | United Kingdom | 101/425 |
| 1255063 | 11/1971 | United Kingdom | 15/256.52 |

*Primary Examiner*—Marc L. Caroff
*Attorney, Agent, or Firm*—Armstrong, Nikaido, Marmelstein & Kubovcik

[57] ABSTRACT

A process for washing exposed photosensitive resin printing plates to remove uncured resin with a washing liquid, said process comprising a first step in which the washing liquid is sprayed on the surface of the resin plate attached to the surface of a rotary drum while rotating said drum to remove most of the uncured resin, and a second step in which the remaining uncured resin is perfectly eliminated by contacting a rotating brush against the surface of the resin plate on said rotating drum.

16 Claims, 4 Drawing Figures

PROCESS AND APPARATUS FOR WASHING PHOTOSENSITIVE RESIN PRINTING PLATES

This invention relates to a resin plate washing process in the manufacture of a photosensitive resin relief printing plate by exposing the surface of the resin plate to actinic light through a negative image and then washing away the unexposed portion with a washing liquid, and an apparatus used for practicing such process.

Photosensitive resin plates are being popularly used recently as relief printing plates employed for newspaper and other general printing or flexographic printing. Generally, in case of using a liquid photosensitive resin for making such photosensitive resin printing plate, the plate surface coated with said liquid photosensitive resin is exposed to actinic light such as for example ultraviolet rays through a negative having a transparent image carrier, whereby to photoset the exposed portion to make such portion insoluble in a washing liquid, and then the plate is washed with the washing liquid to remove the unexposed and uncured portion to thereby make a relief printing plate.

An aqueous solution of a neutral or weakly alkaline detergent is usually used as a washing liquid. As means for removing the uncured portion of photosensitive resin by such washing liquid, there has been popularly used a method in which pressurized washing liquid is ejected from a spray nozzle against the surface of the exposed photosensitive resin plate to substantially physically remove the uncured portion.

Although this method is capable of removing most of the uncured portion, it is still not perfect in use with certain types of resins, and there sometimes remains a thin film of uncured resin on the surface of the removed portion. Such a film, if insolubilized by a treating solution or after-exposure to get rid of tackiness, causes no much inconvenience in the treatment of the plate thereafter. However, when the plate is used for printing, the film staying on the surface of the high part of the relief may give the film pattern to the printed matter to badly impair the printing quality. The degree of leftover of such film varies depending on the properties of the photosensitive resin used, but a high tendency of such film leftover is noted with the resins of the type used for flexographic printing which is gaining popularity of late, particularly those modified to improve solvent resistance. For instance, such a tendency is often experienced in use of the photosensitive resin compositions which comprise as essential constituents a prepolymer, an ethylenic monomer, a photosensitizer and a heat polymerization inhibitor (as disclosed in Japanese Pat. Appln. Kokai (Laid-Open) No. 90304/77), said prepolymer being composed of (a) a hydrogenated 1,2-polybutadiene compound having at least one or two terminal hydroxyl groups per one molecule and/or (b) a compound with average molecular weight of 1,000 to 30,000 obtained by introducing at least one polymerizable ethylenic double bond to the terminal of a compound obtained by chain-extending the compound of (a) with a diisocyanate within the range of 2 to 20 urethane bonds per one molecule.

This invention is intended to provide a resin printing plate washing process which has solved the above-said problems of the prior art and is capable of markedly enhancing the removing efficiency of the uncured portion of the exposed photosensitive resin plate, and an apparatus used therefor.

As it is hardly possible to perfectly remove the uncured thin film remaining on the relief by spray means as said above, the present inventors have attempted mechanical removal by use of a rotary brush. According to such a method, however, the uncured resin is deposited on the brush and such deposited resin is then further deposited on the relief, resulting in an unsatisfactory finish.

It was found however that this problem can be solved by first substantially removing the uncured portion by spray means and then performing finish removal by a rotating brush. This method can prevent redeposition of uncured resin and is also capable of perfectly removing the uncured thin resin film.

It was also found that such removing operation by spray and brush means can be performed at higher efficiency and within a smaller space when the resin plate is placed on a rotary drum and the spraying and brushing operations are practiced around said drum.

This invention was attained on the basis of such findings.

Thus, there is provided according to this invention an improved washing process for removing the uncured portion of the exposed photosensitive resin printing plate with a washing liquid, said process comprising the first step in which the washing liquid is sprayed to the surface of the resin plate attached to the surface of a rotating drum to thereby remove most of the uncured portion, and the second step in which a rotating brush is contacted with the surface of said rotating resin plate to remove the remaining uncured portion.

It is also contemplated in this invention to provide a washing apparatus for removing the uncured portion of the exposed photosensitive resin printing plate with a washing liquid, said apparatus comprising a washing liquid containing tank, a rotary drum provided in said tank at a location above the washing liquid surface therein, said drum being designed such that the exposed photosensitive resin plate may be suitably placed on its surface, a spray means for spraying the washing liquid in said tank toward the surface of said drum, and a rotary brush provided in said tank and adapted movable so as to be able to contact with and separate from the drum surface.

Figure 1:
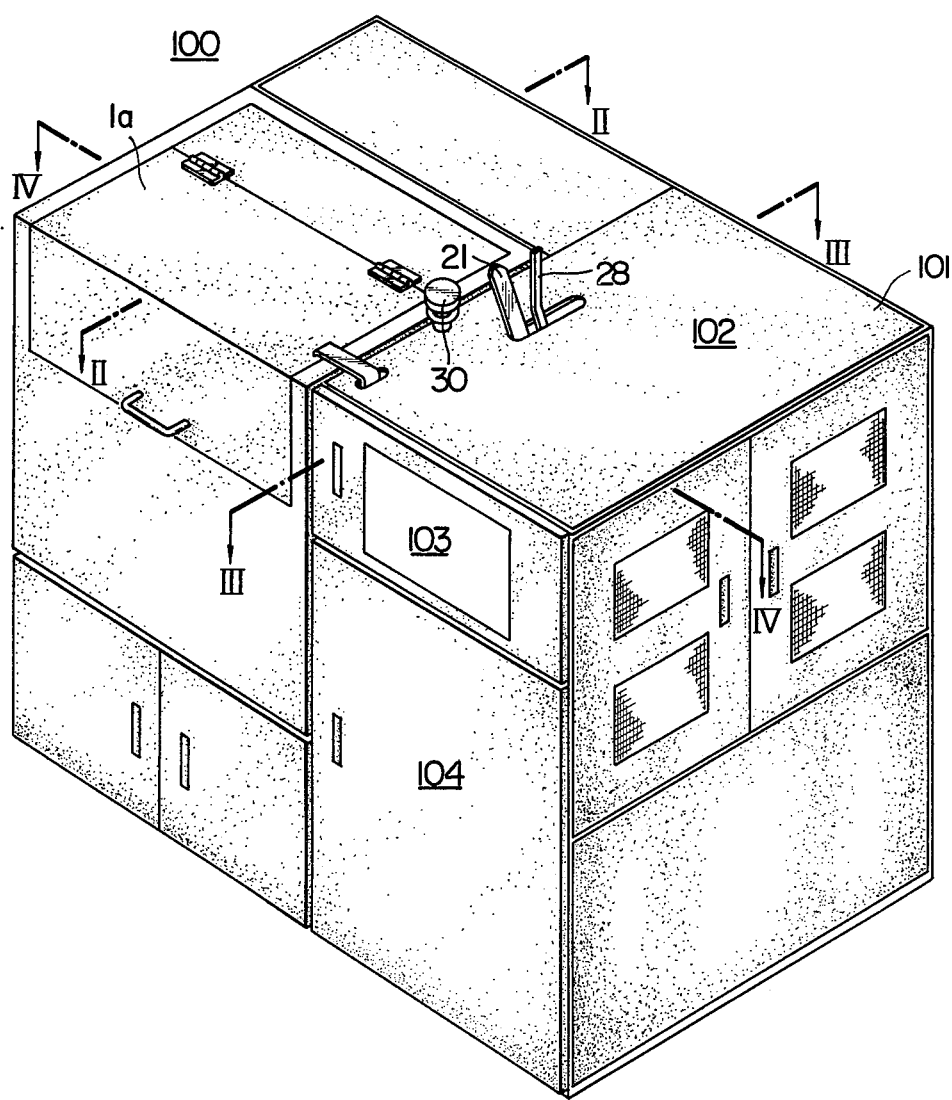
FIG. 1 is a general external perspective view of the washing apparatus used in the present invention.

According to the process and apparatus of this invention, a pressurized washing liquid is sprayed from spray nozzles over the surface of the exposed photosensitive resin plate to remove most of the uncured portion, and then a rotating brush is contacted with the surface of the cured portion where the uncured resin still remains in the form of a thin film, whereby it is possible to eliminate any trace of resin film which might impair the printing quality if it is left on the printing plate. Thus, the present invention is featured by an eminently enhanced uncured resin portion removal efficiency in the preparation of photosensitive resin printing plates.

As said above, spray means alone is incapable of perfectly removing the thin film of uncured resin remaining on the relief, while in case of using a rotary brush alone, uncured resin inevitably deposits on the brush and such resin is then redeposited on the relief, and hence no satisfactory result can be obtained in these cases.

Also, when the removing operations by both spray and brush means are performed simultaneously, there takes place a phonomenon similar to that seen in use of the rotary brush alone, making it impossible to obtain a satisfactory result.

According to the present invention, since a rotary brush is used after the substantial portion of uncured resin has been removed by spray means, there is little possibility of deposition of uncured resin on the brush, and hence it is possible to avoid backward coating, or redeposition, of uncured resin on the relief, thus allowing very effective removal of uncured resin.

The rotary brush used in the second step of this invention for removing the remaining uncured resin portion by rotating contact with the surface of the resin plate mounted on the rotary drum is preferably made of animal hair, most preferably horsehair because of high flexibility, durability and nature of softening with rise of temperature. If desired, however, it is also possible to use synthetic resin such as nylon, polypropylene or such. Anyway, it is recommended to use a brush which is fine and strong in nerve and can well stand use even when the washing fluid is at a relatively high temperature, such as about 50° C.

It is desirable to adjust the operating speed such that when the peripheral speed of the rotary drum is within the range of about 1 to 25 m/min, the peripheral speed of the rotary brush will be within the range of about 30 to 300 m/min, and for better result, adjustment is preferably made such that when the peripheral speed of the rotary drum is about 2 to 10 m/min, that of the brush will be about 50 to 200 m/min. The direction of rotation of the brush may be the same as that of the drum, but they may be of either forward or reverse rotation relative to each other. A preferable method is to conduct at least one operation of forward rotation and at least one operation of reverse rotation of the rotary brush with respect to the direction of rotation of the rotary drum. Such a combination of both rotations allows even perfect removal of the uncured portion on both sides of each relief ridge.

When the rotating brush is contacted with the resin plate surface, said brush may be kept partly immersed in the washing liquid in the tank so that the washing operation is performed while applying the washing liquid to the brush. In the case of certain types of photosensitive resin, the uncured resin which has been removed and separated by the washing operation may be suspended close to the washing liquid surface and may redeposit on the rotating brush. In such a case, it is recommended to position the brush above the washing liquid surface and to perform brushing while flowing down or spraying the washing liquid on the plate surface.

The temperature of the washing liquid is preferably within the range of 40° to 60° C. for obtaining the best washing effect, while the spray pressure is controlled within the range of 0.3 to 10 kg/cm², preferably 1 to 3 kg/cm².

The used washing liquid can be recovered and reused, but it is desirable for keeping the high washing effect to freshly supply only the washing liquid used in the second step.

The photosensitive resin used in the present invention may be a resin which is cured upon exposure to actinic light, or which has reduced solubility in a solvent as compared to its solubility before exposure to actinic light. Such a photosensitive resin composition, for example, comprises a compound containing an addition-polymerizable unsaturated group as the main ingredient and a photopolymerization initiator. There is no particular limitation to the properties of these components so long as a photocurable composition of sufficient mechanical strength to be useful can be achieved nor is there any special limitation in the molecular weight of the resulting photopolymer.

Examples of such compounds containing an addition-polymerizable group are acrylic acid, methacylic acid, esters of these acids, for example, alkyl, cycloalkyl, tetrahydrofurfuryl, allyl, glycidyl, or hydroxyalkyl acrylates or methacrylates, mono- or diacrylates and methacrylates of alkylene glycols or polyoxyalkylene glycols, trimethylol propane triacrylate and methacrylate and pentaerythritol tetracrylate and methacrylate; acrylamide, methacrylamide or their derivatives such as N-methylol acrylamide and methacrylamide, N,N'-alkylene bisacrylamides and methacrylamides, and diacetone acrylamide and methacrylamide; addition-polymerizable unsaturated monomers such as styrene, vinyl toluene, divinyl benzene, diallyl phthalate, triallyl cyanurate, vinyl acetate or acrylonitrile; unsaturated polyesters; alkyd resins; and unsaturated polyurethane resins such as polyurethane monomer having an active hydrogen such as a hydroxyalkyl acrylate or methacrylate.

Examples of photopolymerization initiators are benzoin, benzoin alkyl esters, α-methylbenzoin and alkyl ethers, α-phenylbenzoin, α-allylbenzoin, anthraquinone, chloroanthraquinone, methylanthraquinone, ethylanthraquinone, benzil, diacetyl, acetophenone, ω-bromoacetophenone, α-naphthalenesulfonyl chloride, diphenyl disulfide, and dyes such as eosine or thionine.

The photosensitive resin composition comprises at least one compound containing an addition-polymerizable unsaturated group and a photopolymerization initiator, and, if desired, a heat polymerization inhibitor to increase storage stability such as hydroquinone, p-methoxy phenol, catechol, tert-butyl hydroquinone, benzoquinone, p-phenylenediamine, picric acid, or phenothiazine.

Examples of such photosensitive resin compositions are disclosed in U.S. Pat. Nos. 2,760,863; 2,902,365; 2,927,023; 2,929,710; 2,972,540; 2,997,391; 3,695,877; 3,677,920; and 3,858,510.

The photosensitive resin composition exemplified above is usually coated in the layer form on a support member which is transparent, semi-transparent or opaque to actinic light in intimate contact therewith.

The support member may, for example, be a plastic film or sheet, cellophane film, paper, glass sheet, glass cloth, fabric, or metal such as Al, Fe, etc. Plastic sheets are especially preferred.

For the practice of this invention, the element for the printing plates obtained by forming a variety of said photosensitive compositions on a support may be in the form of either solid or liquid. It is desirable, however, to employ a photosensitive composition which allows relief formation with use of either aqueous or alkaline washing solution.

In this invention, a wide variety of washing liquids may be used in accordance with the photosensitive resin composition selected, such as for example, water, aqueous solutions such as alkaline aqueous solutions, e.g., solutions of NaOH, NaCO₃, NaHCO₃, borax, sodium phosphate, sodium silicate, triethanolamine, or the like, or aqueous solutions of surface active agents, e.g., a soap, alkylbenzene sulfonates, alkylsulfonates, alkylamine chlorides, polyoxyalkylene glycols, polyoxyalkylene glycol alkylethers, polyoxyalkylene glycol alkylesters, sorbitan fatty acid esters, polyoxyalkylene glycol sorbitan acid esters, etc., and organic solvents such as alcohols, e.g., methanol, ethanol, isopropanol, etc., acetone, benzene or trichloroethylene.

Now, the apparatus of this invention used in practicing the above-described process and the modes of use thereof are described with reference to the accompanying drawings.

Referring to FIG. 1, there is shown a preferred form of washing apparatus 100 of this invention having provided at the top of the frame 101 a hinged lid 1a adapted for allowing mounting, demounting and inspection of the resin plate to be treated. Provided below said lid 1a are a washing liquid tank, a pump and other elements. Housed in another block 102 of the frame 101 are a device for adjusting movement of the rotary brush and a driving means for the rotary drum and said brush. At the top of the block 102 are provided a brush handle 21 for said adjusting device, a declutching lever 28 and a microadjusting dial 30. It will be also noted that a control panel 103 is provided at an upper front portion of said block 102. Provided in the inside of the door 104 below said control panel 103 is a control box which houses therein a rotary drum, a rotary brush, a pump power supply and a control unit for controlling these elements.

Figure 2:
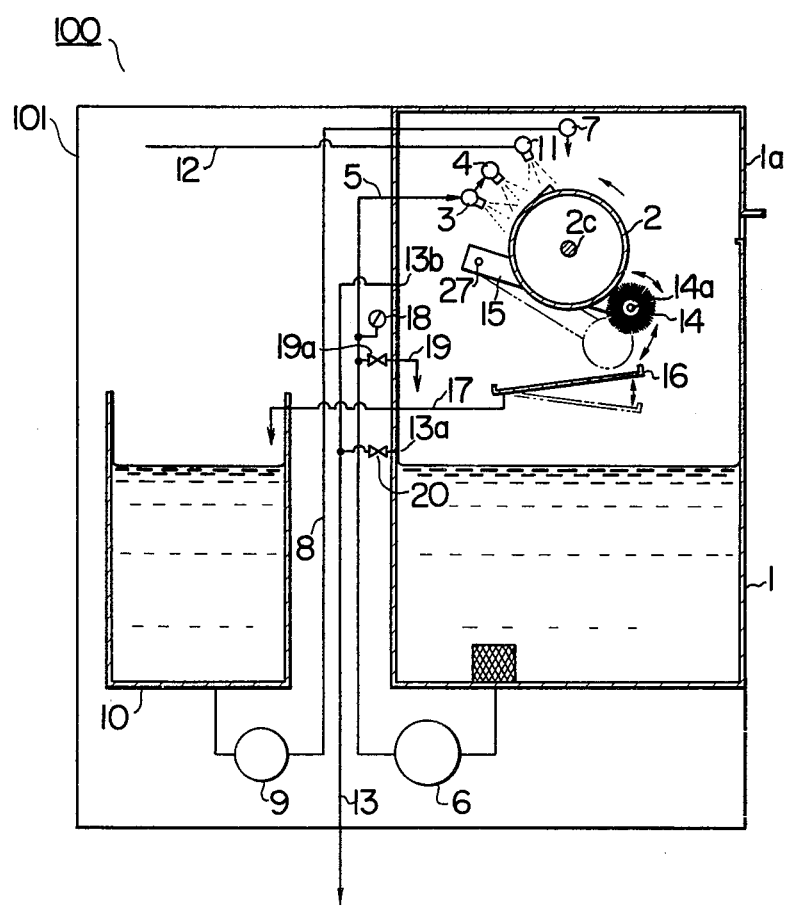
FIG. 2 is an internal sectional view taken along the line II—II of FIG. 1.

Referring now to FIG. 2, there is shown a sectional view of the apparatus of FIG. 1, where it will be seen that a washing liquid tank 1 is provided in the frame 101 of the washing apparatus 100, and a rotary drum 2 is axially supported in said tank 1 such that said drum is rotated by a shaft 2c driven by a driving means not shown. An exposed photosensitive resin plate is fixedly mounted on the surface of said rotary drum 2 by means of a clamping device. Disposed at the parts of the internal side wall of the tank 1 located close to the drum 2 are the nozzles for spraying washing liquid to the drum 2. If need be, these nozzles may be adapted adjustable in positional angle. The nozzles 3 and 4 are connected to the tank 1 through a pipe 5 and a pump 6, while another nozzle 7 disposed rightly above the drum 2 is connected to a fresh liquid tank 11 through a pipe 8 and a pump 9. Still another nozzle 11, which is provided at need, is connected to a water tank (not shown) through a pipe 12 for washing the resin plate with water. There is also provided a pipe 13 for overflowing the washing liquid in the tank 1, said pipe 13 opening into the tank 1 at two spots 13a and 13b disposed at different levels. If desired, the nozzle 7 may be directed sidewise to the drum 2 instead of topwise as in the shown embodiment.

A rotary brush 14 is provided in a manner such that it is movable to contact with and separate from the drum 2, said brush 14 being pivotally mounted at the end of a lever 15 adapted to be swingable in the direction of arrows about the pivot 27. The brush movement adjusting mechanism is described later.

A fresh liquid recovery plate 16 is provided at need below the rotary drum 2 in the tank 1. The fresh liquid is sprayed or flown down when removing the uncured portion on the resin plate surface by contacting the rotating brush 14 against the rotating drum 2, and this fresh liquid, after used, is recovered by said recovery plate 16 and returned back into the tank 10 through the pipe 17. In use of said recovery plate 17, it is slanted upwardly as shown by the solid line in the drawing by a suitable lever provided outside of the tank 1, and when not used, said plate 17 is kept slant downwardly as shown by the chain line. 1a in FIG. 2 indicates the cover of the tank 1.

Figure 3:
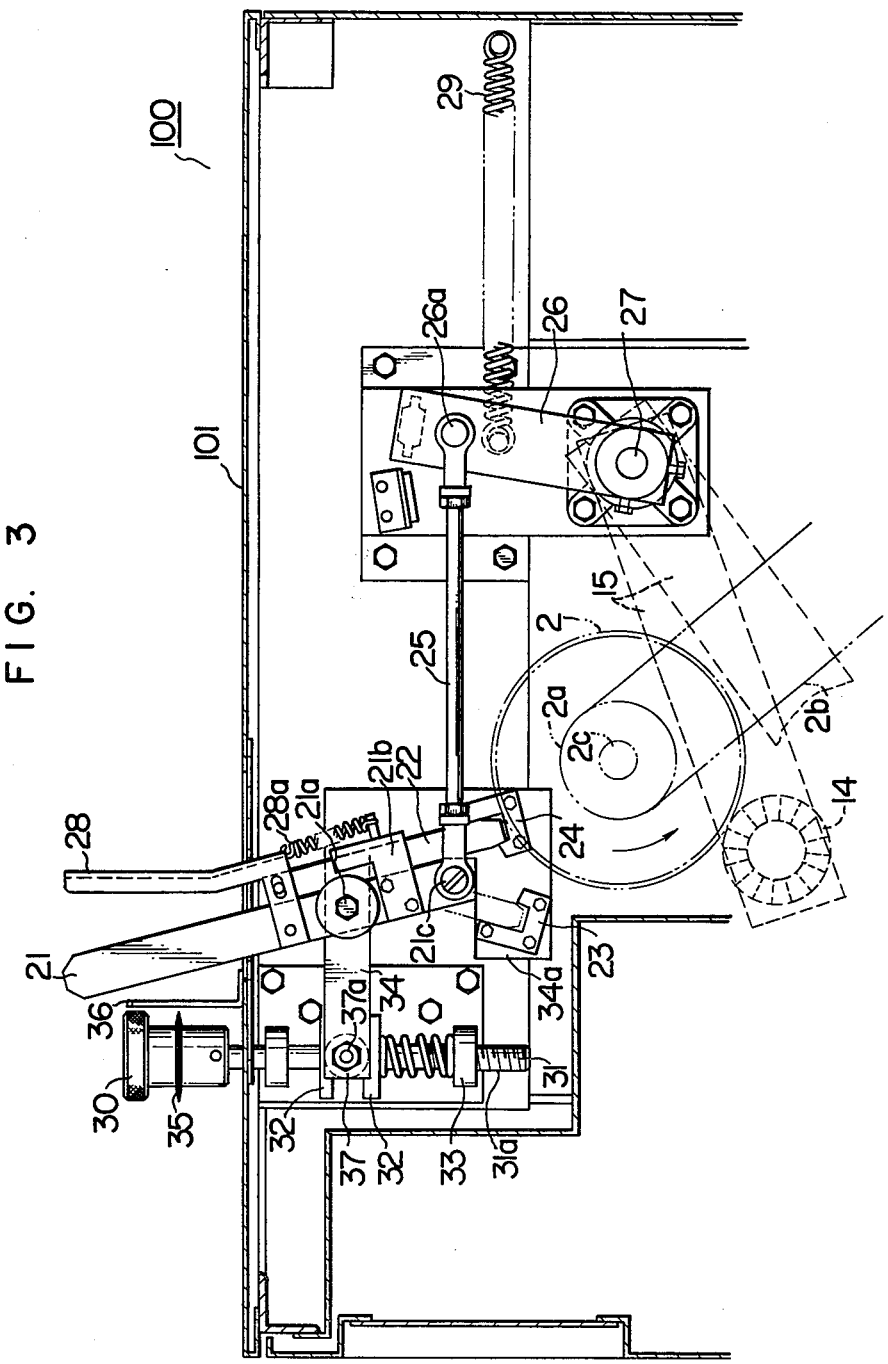
FIG. 3 is a partial sectional view taken along the line III—III of FIG. 1.

In operation of the apparatus, the rotary drum 2 having secured to its surface an exposed photosensitive resin plate by a clamping means is rotated in the direction of arrow by a driving motor (not shown), which is variable in speed, through a suitable driving mechanism, for example a combination of a sprocket 2a and a chain 2b engaging therewith such as shown in FIG. 3, and under this condition, the washing liquid in the tank 1 is pumped up by the pump 6 and sprayed to said rotating drum 2 from the nozzles 3, 4 shown in FIG. 2 under pressure of 0.3 to 10 kg/cm$^2$. By this treatment, most part of the non-exposed and hence uncured portion of the photosensitive resin plate is removed out. During this operation, the fresh liquid recovery plate is kept slant downwards as shown by the chain line in FIG. 2, so that the washing liquid sprayed to the rotating drum flows down into the tank 1 without obstructed by the recovery plate 16 and is not brought into the fresh liquid tank 10.

The spray pressure is adjusted by returning a part of the liquid in the pipe 5 into the tank 1 from a point halfway of said pipe 5 through a by-pass pipe 19 while observing the reading on the pressure gauge 18. 19a is a pressure adjusting valve used in such spray pressure adjusting operation. Such pressure adjustment can be also effected by means of a valve provided halfway in the pipe 5.

Since the opening 13a of the overflow pipe is normally kept open by the valve 20, the liquid level in the tank 1 is maintained normal as shown in the drawing and the washing liquid is used circulatingly for removing the non-exposed uncured portion of the resin plate. Another overflow pipe opening 13b is provided for precaution's sake to avoid trouble in case the opening 13a and/or the line connecting thereto should become clogged.

In the second step of the process of this invention, the rotating brush is contacted with the surface of the rotating drum 2 as shown in the drawing to perfectly eliminate the thin film of uncured resin remaining on the resin plate surface. The brush 14 is rotated by the output shaft of a driving mechanism (not shown) connected to the shaft 14a of said brush. Said driving mechanism comprises a driving motor and a variable speed adjusting means provided through a forward-reverse rotation changeover clutch means connected to the motor shaft, and the output shaft of said driving mechanism is connected by a chain or other means to the shaft 14a of the brush 14.

During this second step operation of removing the thin uncured portion on the resin plate surface by contacting said rotating brush 14 with the rotating drum surface, the nozzles 3 and 4 are kept closed, with the pump 6 being shutdown, and instead the pump 9 is operated to pump up the fresh liquid from its tank 10 and let it flow down or spray it to the rotating drum 2 from the nozzle 7 disposed just thereabove or sidewise thereof to perform washing. This fresh liquid spray is made for bettering finish of washing of the resin plate.

In case of using the fresh liquid recovery plate 16 in the second step washing operation, said plate is raised up aslant as shown by the solid line in the drawing so that the fresh liquid which has flown down along the periphery of the rotating drum 2 is returned back into the tank 10 via the pipe 17. Since the uncured portion of the resin plate to be treated in the second step is usually of an extremely thin film, the amount of resin removed in this step is very limited, and hence the degree of contamination of fresh liquid caused by such recovery remains negligibly slight for a long period of time.

The process of this invention may be practiced without using said fresh liquid recovery plate 16. In this case, said recovery plate 16 is not provided or it is kept slanted downwardly even in the second step as shown by the dotted line in the drawing so that the fresh liquid which has passed the rotating drum 2 will flow down into the tank 1. The washing liquid level in the tank 1 is maintained constant by dint of the overflow pipe opening 13a. Since the removed uncured resin wafting or suspended close to the liquid surface is discharged out through the pipe 13, said suspended matter created in the first step is discharged out in the second step to prevent rise of concentration of the washing liquid in the tank 1 due to long-time resin plate washing operations.

Now, the mechanism for adjusting the lever 15 for mounting the rotary brush 14 in relation to the drum 2 is described with particular reference to FIG. 3.

FIG. 3 shows the condition where the brush 14 is in contact with the drum surface. The brush handle 21 projecting above the apparatus through the top of the frame 101 is arranged swingable reciprocatively (to the right and left in FIG. 3) about the shaft 21a fixed to the frame 101. A member 21b is bolted to the lower part of said brush handle 21, and a pawl 22 is vertically slidably adapted to said member 21b. The lower end of said pawl 22 is engaged in a first pawl catch 24 secured to the lower part 34a of a movable plate 34 to thereby fix the brush handle 21 at the position of FIG. 3. At the lowermost end of the brush handle 21 is provided a pivotal shaft 21c to which an end of a connecting lever 25 is pivotally secured. The other end of said connecting lever 25 is pivotally secured to a shaft 26a provided to an auxiliary brush lever 26. The lower end of said auxiliary brush lever 26 is pivotally secured to a shaft 27 journalled in a side of the frame 101. Also, a tension spring 29 is provided between an upper part of the auxiliary brush lever 26 and the frame 101.

Figure 4:
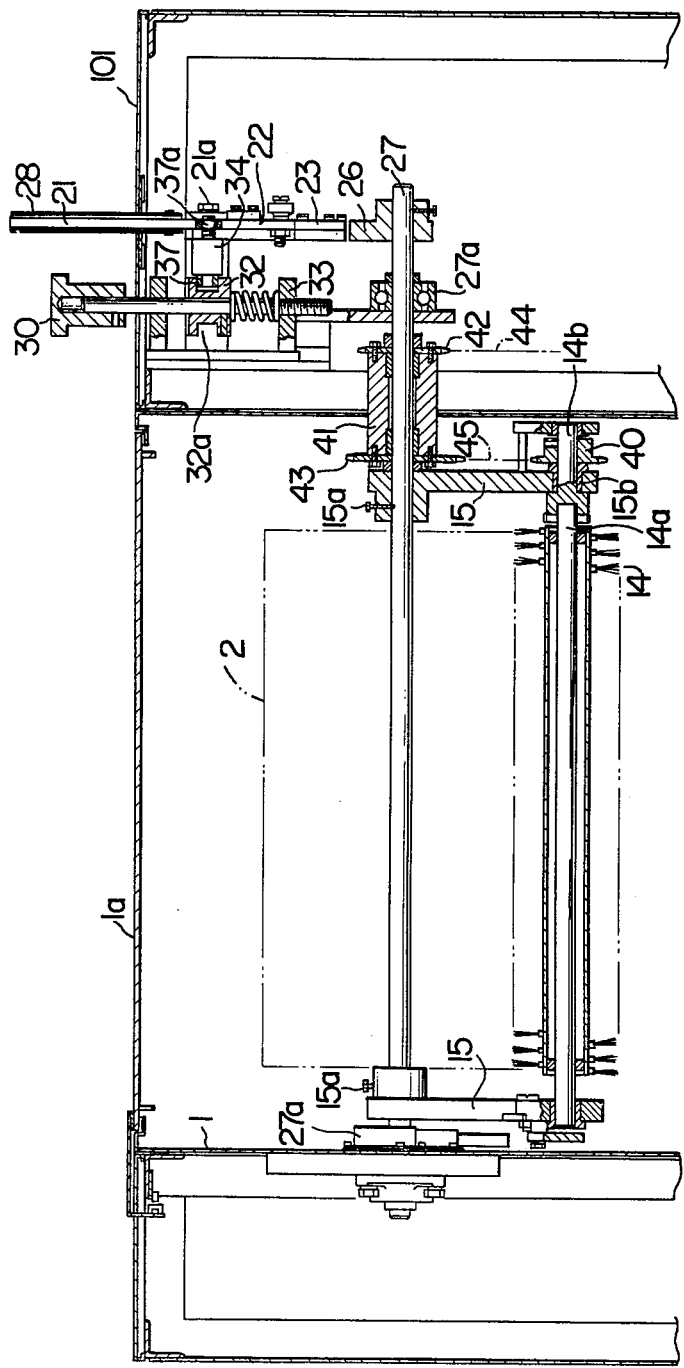
FIG. 4 is a partial sectional view taken along the line IV—IV of FIG. 1.

As shown in FIG. 4, said shaft 27 is pivotally secured to the frame 101 by bearings 27a, and a pair of brush mounting levers 15 are fixed by the respective set screws 15a between said bearings. At the lower end of each said brush mounting lever 15 is a hole 15b through which a shaft 14b secured to the brush shaft 14a is passed through a bearing. A sprocket 40 is also secured to said shaft 14b. Provided rotatably on the shaft 27 is a bearing means 41 which has secured at its both ends the sprockets 42 and 43. A chain 44 is passed round said sprocket 42 to connect it to the corresponding sprocket on the output shaft of the driving motor (not shown) adapted for rotating the rotary brush 14. The driving motor used in this invention is of a rotation reversible type and is preferably variable in speed. Such type of motor is usually easily available.

A chain 45 is also passed round another sprocket 43 to connect it to the sprocket 40 on the shaft 14b. In FIG. 4, the rotary drum 2 is shown by dotted chain line rearwardly of the shaft 27 on the sheet.

Now the operation for moving the rotating brush 14 away from the rotating drum 2 is explained by referring back to FIG. 3. The operator pulls the pawl release lever 28 toward the brush handle 21 against the tension of the spring 28a to let the pawl 22 slide upwardly so that it is disengaged from the catch 24, and then the brush handle 21 is turned to the right in FIG. 3 to bring the lower end of the pawl 22 to the position of engagement with another catch 23. Thereafter, the pawl release lever 28 is returned back to its original position to let the lower end of the pawl 22 fit into the catch 23. The connecting lever 25 is also moved to the left against the force of the tension spring 29, causing the auxiliary brush lever 26 to turn to the left about the shaft 27, whereby said shaft 27 is turned accordingly to let the brush mounting lever 15 fixed thereto move away from the drum 2.

The means for adjusting the brush contact pressure against the rotating drum is now described.

As shown in FIG. 3, an adjusting dial 30 is provided above the top surface of the frame 101, said dial having secured thereto a shaft 31 which extends through the frame 101. Said dial device 30 is also provided with an indicator plate 35, and a graduated plate 36 is secured to the frame 101 in correspondence to said indicator plate 35. The lower portion of said shaft 31 is threaded, and this threaded portion 31a is threadedly joined into a corresponding tapped hole in a member 33 fixed to the frame 101. A guide member 32 is also secured to the shaft 31. Said guide member 32, as seen from its sectional view in FIG. 4, is provided with a recession 32a into which a pin 37 slidably fits. The other end of said pin 37 passes through a hole formed at an upper end of the movable plate 34 and is secured to said plate 34 by a bolt 37a.

When the adjusting dial 30 is turned, the guide member 32 secured to the shaft 31 of said dial is moved vertically while rotating. As the pin 37 is slidably fitted in the recession 32a of the guide member 32, said pin is moved in accordance with the movement of said guide member 32, causing the movable plate 34 to accordingly move swinging sidewise about the shaft 21a. The pawl catches 23 and 24 secured to the lower portion 34a of the movable plate 34 are also moved together with said plate, so that the entire brush handle assembly is also moved turning sidewise about the shaft 21a, producing the same result as when the brush handle 21 itself was moved and adjusted, and thereby the contact pressure between the rotating drum 2 and brush 14 can be adjusted.

Shown in the above-described example is a brush movement adjusting mechanism by use of a manual handle lever, but it is easy to effect such adjusting operation automatically by combining the mechanical driving of the brush handle by means of a driving motor or a hydraulic cylinder and the mechanical driving of the pawl release lever by means of a timer-operated electromagnetic plunger, thereby to let said adjusting mechanism operate automatically according to the instruction from said contrc. unit.

What is claimed is:

1. A process for washing uncured resin from exposed photosensitive resin printing plates by means of a washing liquid, comprising the steps of: spraying a washing liquid on a photosensitive surface of said exposed resin plate, said plate being attached to a rotary drum on the drum outer surface, and rotating said drum, thereby to remove most of the uncured resin, and thereafter placing a rotating brush in contact with said surface of said resin plate on said rotating drum, and rotating said brush to remove remaining uncured resin.

2. A process according to claim 1, wherein the peripheral speeds of said rotating drum and brush are about 1 to 25 m/min and about 30 to 300 m/min, respectively.

3. A process according to claim 1 or 2 wherein at least one operation of forward rotation and at least one operation of reverse rotation of said rotating brush is conducted with respect to the direction of rotation of said rotary drum.

4. A process according to claim 1 wherein said rotating brush is composed of animal hair.

5. A process according to claim 1 wherein said spraying and contacting of said brush steps are performed above a washing liquid tank, and wherein the sprayed washing liquid flows down into said tank after use, and is circulated for repeated use.

6. A process according to claim 1 which further comprises spraying washing liquid on said surface of said resin plate when said rotating brush is contacting said resin plate surface.

7. A process as in claim 6 further comprising recovering said washing liquid which has been sprayed and spraying said recovered liquid back on said surface wherein all of said sprayed recovered liquid is sprayed prior to contacting said rotating brush with said plate surface and freshly supplied liquid is sprayed on said plate surface when said rotating brush is in contact therewith.

8. An apparatus for washing uncured resin from exposed photosensitive resin printing plates with a washing liquid comprising: a washing liquid tank, a rotary drum disposed above said washing liquid tank at a point above a liquid fill point on said tank, said drum having means for holding an exposed photosensitive resin plate on the drum outer surface, a spray means for spraying a washing liquid supplied from said tank toward the surface of said drum, a rotary brush disposed in said tank, and means to move said brush into and out of contact with said drum surface.

9. A washing apparatus as in claim 8, wherein the peripheral speeds of said rotary drum and brush are about 1 to 25 m/min and about 30 to 300 m/min, respectively.

10. A washing apparatus as in claim 8 or 9 wherein said rotary brush is connected to a drive means for rotating said brush in either the forward or reverse direction with respect to the direction of rotation of the rotary drum.

11. A washing apparatus as in claim 8 further comprising a spindle shaft connected to a shaft for said rotary brush by an arm means and having a shaft parallel to said brush shaft, and a means for revolving said spindle shaft, wherein the movement of the rotary brush is effected by the revolution of said spindle shaft.

12. A washing apparatus as in claim 11 wherein said revolving means is connected to an adjustable limiting means for limiting the range of revolution of said spindle shaft.

13. A washing apparatus as in claim 8, wherein said spray means is provided with a means for adjusting spray pressure.

14. A washing apparatus as in claim 8, wherein said spray means is provided with at least one spray nozzle, said nozzle being adjustable in its positional angle relative to the surface of the rotary drum.

15. A washing apparatus as in claim 8, wherein said rotary brush is disposed above the washing liquid surface in the tank.

16. A washing apparatus as in claim 15 further comprising a nozzle means disposed above said rotary drum, said nozzle means being in connection with a washing liquid supply means wherein the washing liquid supplied to said second nozzle means is supplied from said tank or a supplementary feed tank.

* * * * *